United States Patent [19]
Swift

[11] Patent Number: 5,930,745
[45] Date of Patent: Jul. 27, 1999

[54] FRONT-END ARCHITECTURE FOR A MEASUREMENT INSTRUMENT

[75] Inventor: Steven D. Swift, Seattle, Wash.

[73] Assignee: Fluke Corporation, Everett, Wash.

[21] Appl. No.: 08/840,086

[22] Filed: Apr. 9, 1997

[51] Int. Cl.$^6$ ...................................................... G01D 3/00
[52] U.S. Cl. ........................... 702/190; 702/57; 702/189; 327/100; 364/724.011
[58] Field of Search ..................................... 702/190, 189, 702/198, 57; 324/76.11, 99 D; 327/100; 341/126, 137, 155; 340/870.21; 364/724.011, 724.013, 724.1

[56] References Cited

U.S. PATENT DOCUMENTS

| | | | |
|---|---|---|---|
| 4,950,999 | 8/1990 | Agnello et al. | 324/77 B |
| 5,051,799 | 9/1991 | Paul et al. | 375/25 |
| 5,255,202 | 10/1993 | Kido et al. | 364/483 |
| 5,392,042 | 2/1995 | Pellon | 341/143 |
| 5,475,651 | 12/1995 | Bishop et al. | 367/88 |
| 5,485,393 | 1/1996 | Bradford | 364/483 |
| 5,532,944 | 7/1996 | Battista | 364/602 |
| 5,592,165 | 1/1997 | Jackson et al. | 341/143 |
| 5,600,318 | 2/1997 | Li | 341/143 |
| 5,619,202 | 4/1997 | Wilson et al. | 341/143 |
| 5,621,345 | 4/1997 | Lee et al. | 327/254 |
| 5,684,850 | 11/1997 | Warburton et al. | 378/53 |
| 5,698,984 | 12/1997 | Little et al. | 324/601 |
| 5,724,037 | 3/1998 | Lee | 341/143 |

OTHER PUBLICATIONS

Parry, "Digital Conversion", Electronics Weekly, Mar. 2, 1994.

McGrath, "Today's ASICs Are Taking on a Powerful New Role", Electronic Engineering Times, 1992.

Fluke Corporation, "Fluke 93,95,97 ScopeMeter Service Manual", Nov. 1991, pp. 3–1 to 3–5 and 3–21, Philips Export B.V, The Netherlands.

Fluke Corporation, "860 Series Graphical Multimeters Service Manual", Jul. 1995, pp. 2–3, 2–13 to 2–21, Fluke Corporation, Everett, Washington.

Primary Examiner—Patrick Assouad

[57] ABSTRACT

A front-end architecture is provided for a measurement instrument having a single path for the input signal for conversion into digital samples. A signal conditioner may be coupled via a pair of test leads across a voltage source, current source, or component to develop an input signal. The input signal is provided to a sampling system, which comprises a sigma-delta converter followed by a decimation filter, which over-samples the input signal to produce a continuous stream of digital samples. The digital samples are provided to a set of digital extraction filters, each digital extraction filter having a structure and transfer function adapted for extracting a measurement parameter from the stream of digital samples. Parameter extraction is performed on a continuous basis so that the digital samples and the resulting digital measurement values arrive in a continuous stream. Extracted parameters include the d.c. value of the input signal, the rms value of the input signal, the waveform parameters of the input signal, and the peak min/max values of the input signal.

12 Claims, 6 Drawing Sheets

FRONT-END ARCHITECTURE FOR A MEASUREMENT INSTRUMENT

BACKGROUND OF THE INVENTION

This invention relates generally to electronic measurement instruments and in particular to a front-end architecture for an electronic measurement instrument using digital filters for extracting measurement parameters from digital samples.

Digital multimeters (DMMS) are a type of electronic measurement instrument which provide the ability to measure various physical parameters such as a.c. voltage and current, d.c. voltage and current, and resistance. Additional measurement capabilities are being added to new DMM designs, including diode check, capacitance, temperature, and frequency counter/timer measurements. Other more specialized measurement parameters may also be added for particular applications, such as measuring d.c. current in the microamp range for heating, ventilation, and air conditioning (HVAC) service applications.

Measuring a wider variety of measurement parameters has required the use of relatively complex signal conditioning circuits to receive the signal developed across the instrument input terminals and produce an input signal suitable for conversion to digital samples. Signal conditioning circuits may include ranging circuits consisting of analog amplifiers and attenuators to scale the input signal to a usable amplitude for the analog-to-digital converter (ADC). Signal conditioning circuits may also include voltage protection circuitry, such as mechanical relays, metal oxide varistors (MOVs), and positive temperature coefficient resistors, to prevent damage to the DMM when probing out-of-range voltages. Physical parameters such as a.c. and d.c. current flow, temperature, and pressure, must all be converted to an input voltage of suitable amplitude for conversion into digital samples by the ADC.

The input signal is split in the signal conditioning circuit of the DMM into two paths—an a.c. or high frequency path and a d.c. or low frequency path. The d.c. path of the input signal is typically developed by low pass filtering the input signal to ideally obtain only a d.c. voltage. The cut-off frequency of the actual low pass filter is typically less than ten hertz, allowing some a.c. signal content to be present. The d.c. voltage developed by the low pass filter is then provided to an ADC to produce digital samples. The low frequency path requires calibration for gain and offset voltage. The high frequency path requires calibration in terms of gain versus frequency to account for the low frequency roll-off.

The ADC provided in most DMMs has a maximum sample rate of less than 100 samples per second, but with 3 ½ to 4 ½ digits of resolution. In order to accurately measure a.c. signals, such as power line signals in the 50/60 hertz frequency range, a root mean square (rms) to d.c. converter is provided in the a.c. path to develop a d.c. voltage which is representative of the a.c. rms value. The rms converter is typically implemented in DMMs as a monolithic integrated circuit.

Digital storage oscilloscopes (DSOs) are another type of electronic measurement instrument that allows for digitally sampling the input signal for subsequent calculation of signal parameters. DSOs provide for switchable a.c. coupled and d.c. coupled paths for the input signal. ADC technology has evolved to provide sampling rates well over 100 megasamples per second, allowing the input signals to be converted directly to digital samples which are stored as a time record in acquisition memory. From this time record, the waveform and various signal parameters may be calculated. However, the signal conditioner in DSO front ends is optimized only for the acquisition of signal voltages. The ability to measure other parameters such as resistance or current, which are low frequency physical parameters, has not been incorporated into traditional DSOs. Hybrid measurement instruments have been developed that combine DMM technology for measuring a wide variety of physical parameters with DSO technology for waveform analysis.

In FIG. 1, there is shown a drawing (not to scale) of a measurement instrument 10 having a pair of test probes 12a and 12b for measuring a variety of physical parameters including a.c. volts and current, d.c. volts and current, resistance, and capacitance, among others. The measurement instrument 10 may also provide for testing passive two-terminal components such as diodes using current and voltage sources (not shown) to generate a stimulus signal across the component. It is desirable that the measurement instrument 10 have the versatility to measure a wide variety of physical parameters.

On a front panel of the measurement instrument 10, there is mounted a graphical display 14 which may show numerical measurement parameters such as "117 VAC rms" in the manner of a DMM as well as a graphical representation of the waveshape of the input signal in the manner of a DSO. The measurement instrument 10 may be coupled to a voltage source 16, a current source 18 shown in FIG. 2, or a component 20 shown in FIG. 3. The component 20 may comprise any of a variety of passive, two-terminal components, including resistors, capacitors, inductors, diodes, or any other two-terminal device amenable to measurement and analysis by the measurement instrument 10.

In FIG. 4, there is shown a simplified block diagram of a measurement front-end 98 according to the prior art as used in the Fluke 860 Graphical Multimeter measurement instrument. The pair of test probes 12a and 12b is coupled across the voltage source 16 to couple a voltage signal to a signal conditioner 50. The signal conditioner 50 may comprise amplifiers, dividers, and filters to provide an input signal of suitable amplitude and bandwidth for conversion into digital samples. The signal conditioner 50 may further comprise various forms of voltage protection circuitry (not shown) to prevent damage to the measurement instrument 10 from over-voltage and over-current conditions. The signal conditioner 50 may also comprise various circuits to convert various physical parameters into the input signal. For example, a.c. and d.c. current from the current source 18 are measured by developing a voltage drop developed across a calibrated current shunt or current clamp. Resistance is measured by measuring the voltage drop across the component 20 using a current source or voltage source (not shown) within the signal conditioner 50. Given the multitude of parameters that must be accommodated and converted to an input signal and the need to provide over-voltage and over-current protection, significant demands are placed on the signal conditioner 50, resulting in added circuit complexity and cost.

The input signal developed by the signal conditioner 50 is coupled to an input of a low pass filter 52 which produces a d.c. signal which is then coupled to a d.c. position of a switch 55. The low pass filter 52 typically has a roll-off frequency reasonably close to 0 Hertz to produce the d.c. component of the input signal while rejecting the a.c. components. The d.c. signal is supplied to a slow ADC 54 via the switch 55 in the d.c. position. The slow ADC 54 produces digital samples of the d.c. signal at a sample rate typically less than 100 Hertz but with 3 ½ to 4 ½ digits of resolution. The low pass filter 52 is typically used on input signals that are primarily d.c. in nature in order to produce accurate measurements of typical d.c. parameters such as d.c. voltage and current, and resistance.

An rms converter 56 also receives the input signal and is coupled to an a.c. rms position of the switch 55. The rms converter 56 is used for input signals that are a.c. in nature in order to produce a d.c. voltage that is representative of the rms value of the input signal which is supplied to the slow ADC 54 when the switch 55 is in the a.c. rms position. The rms converter 56, low pass filter 52 and slow ADC 54, in combination with the signal conditioner 50 collectively comprise the front end architecture commonly found in DMMs and is labeled the DMM FRONT END.

Additional waveform capability is provided in the measurement instrument 10 by adding circuitry collectively comprising a WAVEFORM FRONT END. A signal conditioner 51 accepts the input signal to produce a second input signal for conversion into digital samples. A fast ADC 58 receives the input signal from the signal conditioner 51 and produces digital samples at a sample rate substantially higher than the sample rate of the slow ADC 54 but typically at less resolution. An acquisition memory 60 receives the digital samples and stores them in an acquisition memory 60 to form a digital time record of the waveform of the input signal. A trigger 62 provides a trigger signal to determine the starting point of the waveform in the digital time record in the manner well known in the art for DSOs. A peak min/max 64 operates as a digital comparator to store the maximum and minimum values being stored in the acquisition memory 60 and provides the maximum and minimum values as digital samples.

The waveform front end comprised of the fast ADC 58, acquisition memory 60, and trigger 62 in conjunction with the signal conditioner 51 are typical of front end architectures found in DSOs. The input signal is acquired over a discrete acquisition time in order to fill the acquisition memory 60. A digital interface 66 receives the digital samples from the slow ADC 54, the peak min/max 64, and the acquisition memory 60 for use by the rest of the measurement instrument 10 as digital measurement values.

The signal conditioner 51 provides for voltage-protection and scaling similar to the signal conditioner 50 but in a manner that is optimized for waveform acquisition. The signal conditioner 51 allows for connection of the measurement instrument 10 to the voltage source 16 but not directly to the current source 18 or the component 20. Furthermore, different design considerations for the signal conditioner 51 from that of the signal conditioner 50, including frequency response flatness over a broader range of frequencies than that of the signal conditioner 50, may become important.

In FIG. 5, there is shown there is shown a simplified block diagram of a measurement front-end 99 according to the prior art as used in the Fluke 93, 95, and 97 oscilloscope measurement instruments. The pair of test probes 12*a* and 12*b* is coupled across the voltage source 16 to couple a voltage signal to a signal conditioner 70. The signal conditioner 70 may comprise amplifiers, dividers, and filters to provide an input signal of suitable amplitude and bandwidth for conversion into digital samples. The signal conditioner 70 may further comprise various forms of voltage protection circuitry (not shown) to prevent damage to the measurement instrument 10 from over-voltage and over-current conditions. Like the signal conditioner 51 shown in FIG. 4, the signal conditioner 70 is optimized for waveform acquisition.

A second pair of test probes 12*a*' and 12*b*' is coupled across the component 20 to allow for measurement of resistance or other component parameters. The pair of test probes 12*a*' and 12*b*' are coupled to a signal conditioner 70 which is optimized for low frequency measurements. In the preferred embodiment, there is no provision for the measurement of the current source 18. External current clamps or shunts may be used to provide a voltage signal to either of the signal conditioners 70 or 72. A switch 74 having a DIODE OHMS position coupled to the signal conditioner 70 and a VOLTS position coupled to the signal conditioner 72 selectively couples the input signal to an ADC 76 which digitizes the input signal and produces digital samples which are placed in acquisition memory 78. A trigger 80 which also receives the input signal and generates a trigger signal may be used to time the start of a particular data acquisition. The contents of the acquisition memory 78 may be analyzed to produce a variety of parameters which are provided to a digital interface 82 which in turn provides digital measurement values to the measurement instrument 10. While the measurement front end 99 requires only a single ADC 76, separate signal paths via the signal conditioners 70 and 72 and the switch 74 are maintained. Signal parameters are not extracted continuously but only from the portion of the input signal that is actually digitized, which may only be a small fraction of the total time.

The continued use of separate DMM and waveform signal paths, with separate signal conditioners optimized for waveform acquisition and low frequency DMM measurements, results in a substantial duplication of components and increased manufacturing cost and complexity in the measurement instrument 10. The ability of such measurement instruments to be adapted for measuring new types of signal parameters may also be severely limited because of this bifurcated structure. Therefore, it would be desirable to provide a front-end architecture for a measurement instrument that has only one path for the input signal that allows for the continuous extraction of multiple types of signal parameters.

SUMMARY OF THE INVENTION

In accordance with the present invention, a front-end architecture is provided for a measurement instrument having one path for the input signal for conversion into digital samples by an ADC. The digital samples are provided to a digital filter for extraction of a number of selected parameters which are provided to the measurement instrument as digital measurement values.

A signal conditioner may be coupled via a pair of test leads across a voltage source, current source, or component to develop an input signal. The input signal is provided to a sampling system, which comprises a sigma-delta converter followed by a decimation filter, to produce digital samples. Alternatively, the sampling system may comprise an ADC to provide the digital samples.

The digital samples are provided to a set of digital extraction filters, each digital extraction filter having a structure and transfer function adapted to extract a physical parameter from the stream of digital samples. Parameter extraction is performed on a continuous basis so that the digital samples and the resulting digital measurement values arrive in a continuous stream. Because each of the digital extraction filters receives the same digital samples and operates in parallel with the other digital extraction filters, multiple measurement parameters may be extracted at the same time from the same digital samples.

The set of digital extraction filters allows for the extraction from the digital samples of the d.c. value of the input signal, the rms value of the input signal, the waveform parameters of the input signal, and the peak min/max values of the input signal. The d.c. value, the rms value, the waveform parameters, and the peak min/max values are among the many measurement parameters that may be extracted simultaneously from the continuous stream of digital samples and provided as digital measurement values to the measurement instrument via a digital interface.

One object of the present invention is to provide a front-end architecture for a measurement instrument using one signal path for the input signal.

Another object of the present invention is to provide a front-end architecture for the simultaneous extraction of a number of parameters.

An additional object of the present invention is to provide a front-end architecture having a set of extraction filters for simultaneously extracting parameters from a continuous stream of digital samples of an input signal.

A further object of the present invention is to provide a measurement instrument having capable of measuring a variety of parameters using a simplified front-end architecture.

Other features, attainments, and advantages will become apparent to those skilled in the art upon a reading of the following description when taken in conjunction with the accompanying drawings.

DETAILED DESCRIPTION OF THE INVENTION

Figure 3:
FIG. 3 is an illustration of a component to which the measurement instrument of FIG. 1 may alternatively be coupled.
Figure 2:
FIG. 2 is an illustration of a current source to which the measurement instrument of FIG. 1 may alternatively be coupled.
Figure 1:
FIG. 1 is an illustration of a measurement instrument capable of measuring a variety of physical parameters as coupled to a voltage source.
Figure 1:
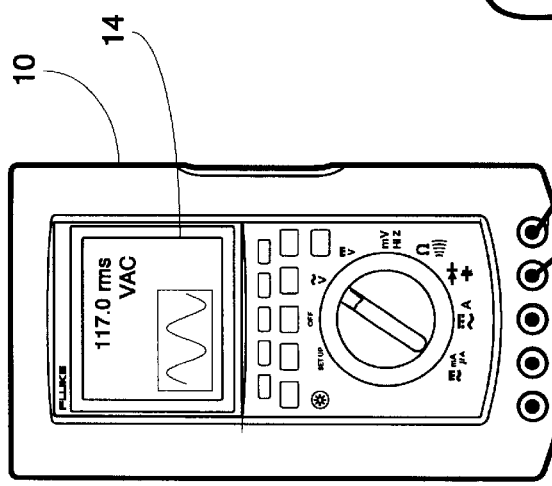
Figure 4:
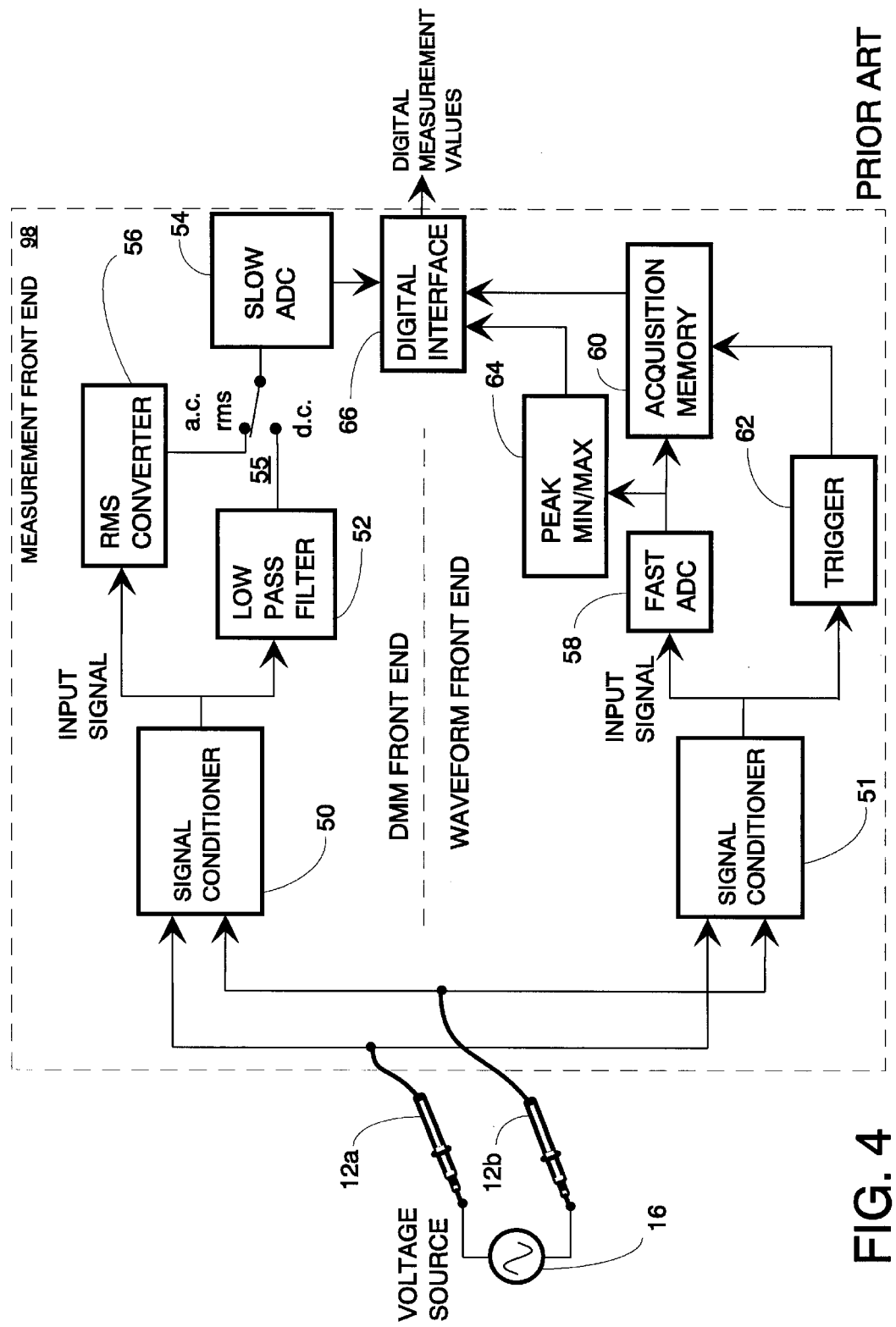
FIG. 4 is a simplified block diagram of a measurement front end for a measurement instrument according to the prior art.
Figure 5:
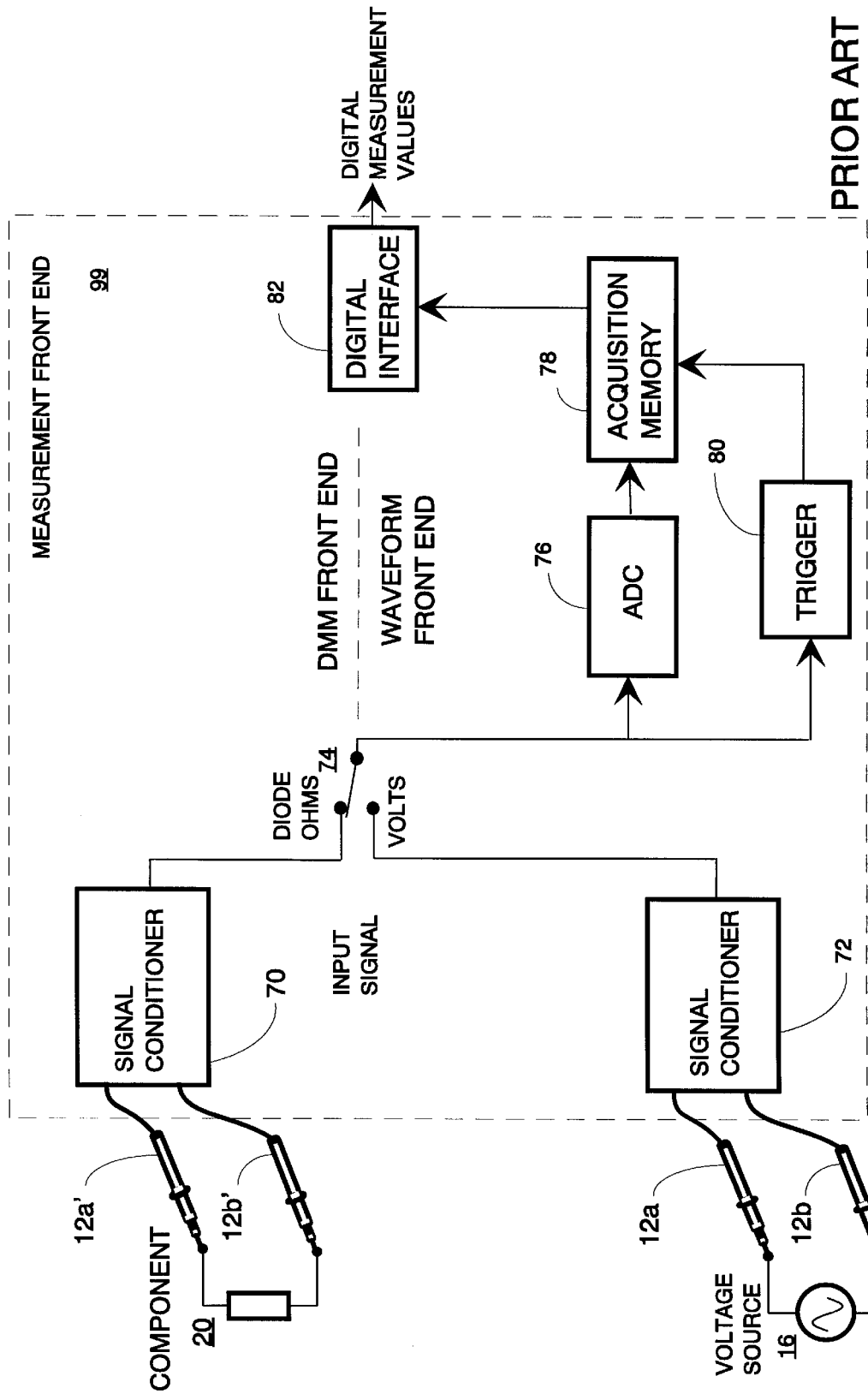
FIG. 5 is a simplified block diagram of a second measurement front end for a measurement instrument according to the prior art.
Figure 6:
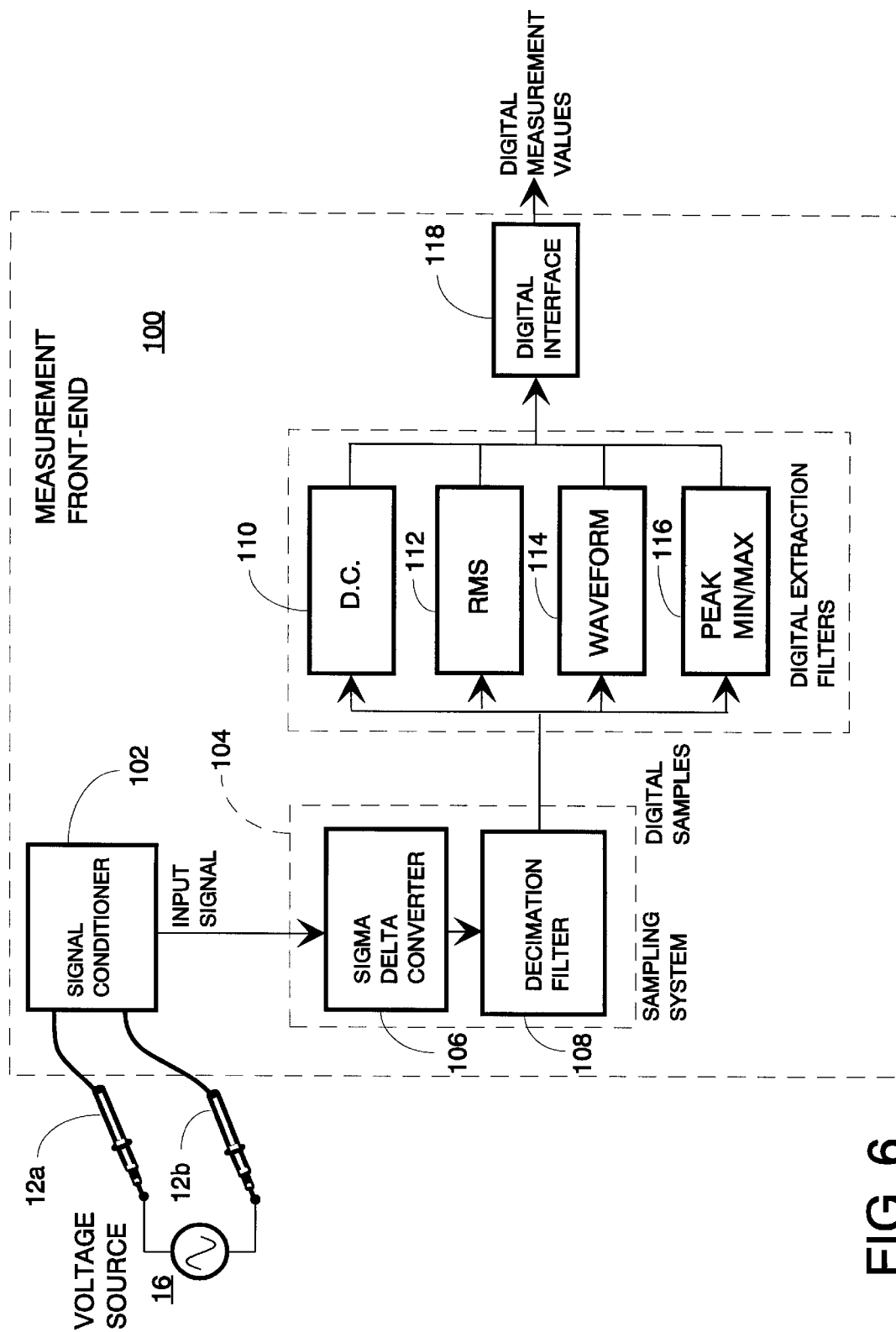
FIG. 6 is a simplified block diagram of a measurement front end for a measurement instrument according to the preferred embodiment of the present invention.

FIG. 6 is a simplified block diagram of a measurement front-end 100 of the measurement instrument 10 shown in FIG. 1 according to the present invention. A signal conditioner 102 is coupled to receive a signal voltage developed across the voltage source 16 via the pair of test leads 12a and 12b in order to measure d.c. or a.c. volts. The signal conditioner 102 may alternatively be coupled to the current source 18 (shown in FIG. 2) to measure d.c. or a.c. current. The signal conditioner 102 may be further coupled to the component 20 (shown in FIG. 3) and configured to measure resistance, capacitance, or other physical parameters. The signal voltage may be developed through appropriate conversion circuits, including a calibrated current shunt in order to measure a.c. or d.c. current. The signal conditioner 102 may be appropriately configured for the desired measurement function typically via microprocessor control (not shown).

The signal conditioner 102 produces an input signal of suitable amplitude and input bandwidth for conversion into digital samples by a sampling system 104. In the preferred embodiment, the sampling system 104 comprises a sigma delta converter 106 which produces raw digital samples at a sampling rate substantially higher than the input bandwidth, a process commonly known in the art as oversampling. The raw digital samples are supplied to a decimation filter 108 which operates to low pass filter the raw digital samples to produce digital samples at a selected sample rate and with an increased number of bits of resolution.

In the preferred embodiment, the input bandwidth is selected to be 500 kilohertz and the input signal is sampled at 10 mega-samples per second, a 20:1 ratio, to produce raw digital samples with 5 bits of resolution. The decimation filter 108 decimates the raw digital samples four times to produce digital samples at a sample rate of 2.5 mega-samples per second with 13 bits of resolution. The decimation filter 108 may be configured as an FIR (finite impulse response), IIR (infinite impulse response) or a combination of IIR and FIR in order to provide a desired transfer function.

To simplify hardware requirements and reduce power consumption, two decimation stages are used in the preferred embodiment. It was an important design consideration that the frequency components above 4.5 megahertz present in the input signal that will alias back into the baseband frequency are sufficiently suppressed in the decimation filter 108. A stopband rejection over 60 decibels (dB) at 4.5 megahertz was chosen in order to obtain the desired measurement accuracy. The exact filter structure and filter constants to achieve the desired transfer function of the decimation filter 108 may be achieved using techniques known in the art.

The digital samples from the decimation filter 108 are in turn provided to a set of digital extraction filters 110–116. Each of the set of extraction filters 110–116 may receive the stream of digital samples at the same time in order to extract selected measurement parameters. The set of digital extraction filters 110–116 are preferably implemented in a single monolithic integrated circuit to reduce component count and power consumption.

The digital extraction filter 10 labeled D.C. is a d.c. extraction filter that has a structure designed to extract the d.c. value of the input signal as received from the signal conditioner 102 and digitized in the sampling system 104. The digital extraction filter 110 has a transfer function of a low pass filter with the following extraction filter parameters in the preferred embodiment:

| | |
|---|---|
| settling time to 0.001% of final value | 0.5 seconds |
| stopband with rejection of over 123 dB | 49.9 hertz |
| passband ripple | 0% |

-continued

| | |
|---|---|
| step response overshoot | 0% |
| data acquisition rates | 0.125, 0.5, 2, and 1000 hertz |

The filter parameters are driven by design requirements that the measurement instrument have a d.c. measurement accuracy of 5 digits at a data acquisition rate of 2 readings per second. The stopband rejection is necessary to reject 50/60 hertz power line frequency ripple. The exact filter structure and filter constants to achieve the desired transfer function of the extraction filter 110 to extract d.c. values may be achieved using techniques known in the art. The extraction filter parameters and associated transfer function may be readily modified to suit the measurement accuracy and data acquisition rates of the particular measurement requirements.

The digital extraction filter 112 labeled RMS is an rms extraction filter that has a structure designed to extract the rms (root mean square) value of the input signal as received from the signal conditioner 102 and digitized in the sampling system 104. The rms value of the input signal can be extracted in a number of ways. In the preferred embodiment, the rms value is calculated on a continuous basis, as explained in more detail below, in a manner that does not depend on having a known signal period or a predetermined measurement period. Alternatively, the rms value may be calculated by integrating the area under the waveform over a predetermined measurement period.

Figure 7:
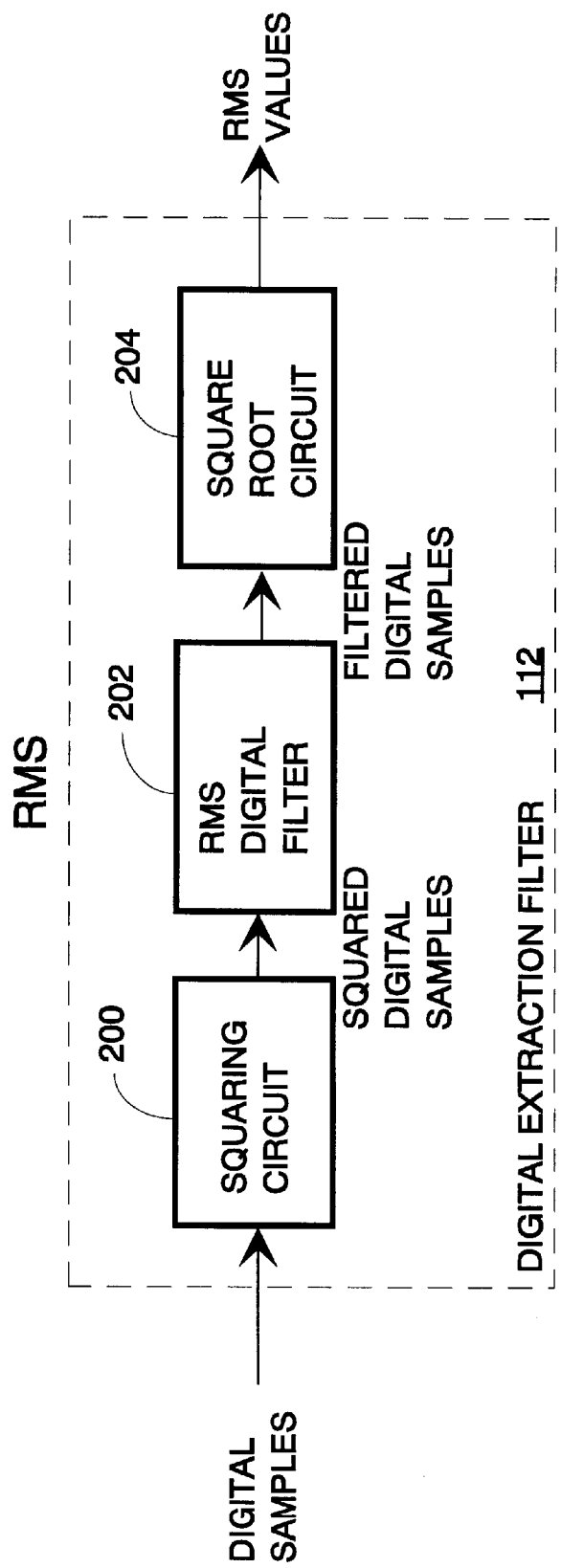
FIG. 7 is a simplified block diagram of a digital extraction filter within the front-configured for extracting rms values from the stream of digital samples on a continuous basis according to the present invention.

FIG. 7 is a simplified block diagram of the digital extraction filter 112 configured for extracting rms values from the stream of digital samples on a continuous basis according to the preferred embodiment of the present invention. Digital samples from the sampling system 104 as shown in FIG. 6 arrive at the digital extraction filter 112. Each digital sample is squared in the squaring circuit 200 to produce squared digital samples. The squaring circuit 200 may comprise a hardware multiplier circuit that is implemented on the same integrated circuit as the digital extraction filter 202. Alternatively, the multiplication may be performed by an external microprocessor to obtain the squared digital sample. Each squared digital sample is provided to an rms digital filter 202 which has filter coefficients chosen to allow the rms digital filter 202 to operate as a low pass filter. The filter coefficients and digital filter topology may be designed according to known IIR and FIR techniques, or a combination of FIR and IIR techniques, to provide a low pass filter having desired characteristics. In the preferred embodiment, the rms digital filter 202 has the following characteristics:

| | |
|---|---|
| measurement bandwidth | 500 kilohertz |
| stopband with rejection of over 123 dB | 49.9 hertz |
| settling time to 0.001% of final value | 0.5 seconds |
| step response overshoot | 0.0% |
| data acquisition rates | 0.125, 0.5, 2, and 1000 hertz |

In the digital rms filter 202, it was a design requirement that there be no overshoot in the step response along with a high stopband rejection of 50/60 hertz ripple from power line frequencies. Filtered rms values produced by the digital rms filter 132 are provided to a square root circuit 204 which produces the rms value by taking the square root of the filtered rms value. The square root circuit 204 may comprise a hardware square root circuit that is implemented on the same integrated circuit as the digital extraction filter 202. Alternatively, the square root operation may be performed by an external microprocessor to obtain the rms value.

The filter parameters were driven by the design requirement that the measurement instrument 10 have an a.c. rms measurement accuracy of 5 digits at a data acquisition rate of 2 readings per second. The stopband rejection is necessary to reject 50/60 hertz power line frequency ripple. The extraction filter parameters and associated transfer function may be readily modified to suit other design requirements for measurement accuracy and data acquisition rates for particular measurement applications. The exact filter structure and filter constants to achieve the desired transfer function of the digital extraction filter 112 to extract a.c. rms values may be achieved using techniques known in the art.

Referring back to FIG. 6, the digital extraction filter 114 labeled WAVEFORM is a waveform extraction filter that has a structure designed to extract waveforms of the input signal as received from the signal conditioner 102 and digitized in the sampling system 104. The digital extraction filter 114 has a transfer function that may be optimized for waveform acquisition. For example, the digital extraction filter may have a structure optimized for glitch capture in which pulses of sufficiently narrow duration and sufficiently high amplitude may cause the event to be stored in memory. Specialized waveforms, such as the ignition pulse found in automotive applications, having a shape and timing parameters that are generally known, may be acquired and optimized for display using the digital extraction filter 114.

The digital extraction filter 114 may incorporate structures including high pass filters, low pass filters, bandpass filters, and band reject filters, for filtering out unwanted frequencies or passing desired frequencies, using techniques known in the art. For example, high frequency noise may be suppressed using a low pass filter structure. A desired signal of known frequency may be selectively passed using a bandpass filter. The versatility in adapting and changing structures of the digital extraction filter 114 provides a significant advantage in allowing the measurement instrument 10 to be readily adapted for measuring a wider variety of signal parameters.

The digital extraction filter 116 labeled PEAK MIN/MAX is a peak min/max extraction filter that has a structure designed to extract only the minimum and maximum values of the input signal as seen in the digital measurement values arriving from the sampling system. The structure need only consist of digital comparators and registers for capturing the minimum and maximum values of the digital samples and are generally capable of being reset by an external signal (not shown). Such a structure, although simple to implement, provides the ability to extract a variety of signal parameters, particularly if combined with other structures to improve the reliability of the extraction process. For example, if it is desired that the peak-peak value of an input signal that is in the form of an a.c. sine wave be extracted from the digital samples, a structure containing a bandpass filter centered around 50/60 hertz ahead of the digital comparators and registers may be employed to reject extraneous noise not related to the desired power line signal, thereby improving the quality of the peak-peak measurement.

The d.c. values, a.c. rms values, waveform parameter values, and peak min/max values provided by the digital extraction filters 110–116 respectively are presented to a digital interface 118 which in turn selectively provides each of these values as desired to the remaining portions of the measurement instrument 10 as digital measurement values. The digital interface 118 thus allows the measurement parameters to be organized and made available to the measurement instrument 10 as needed, typically according to the selected parameters for display and the display update rate. The digital interface 118 may be implemented using buffers, memory, and other digital devices commercially available for storing and transferring digital data.

The measurement front-end 100 thus provides digital measurement values according to the desired measurement functions of the measurement instrument 10. Because there is only one path for the input signal, with no distinction made between a.c. and d.c. paths before conversion into digital samples, the requirements on the signal conditioner 102 are greatly simplified. Because the set of digital extraction filters 110–116 allows for the simultaneous extraction of any number of desired parameters from the same input signal, the ability of the measurement instrument 10 to be adapted for measuring a wider variety of signal parameters is substantially enhanced.

Figure 8:
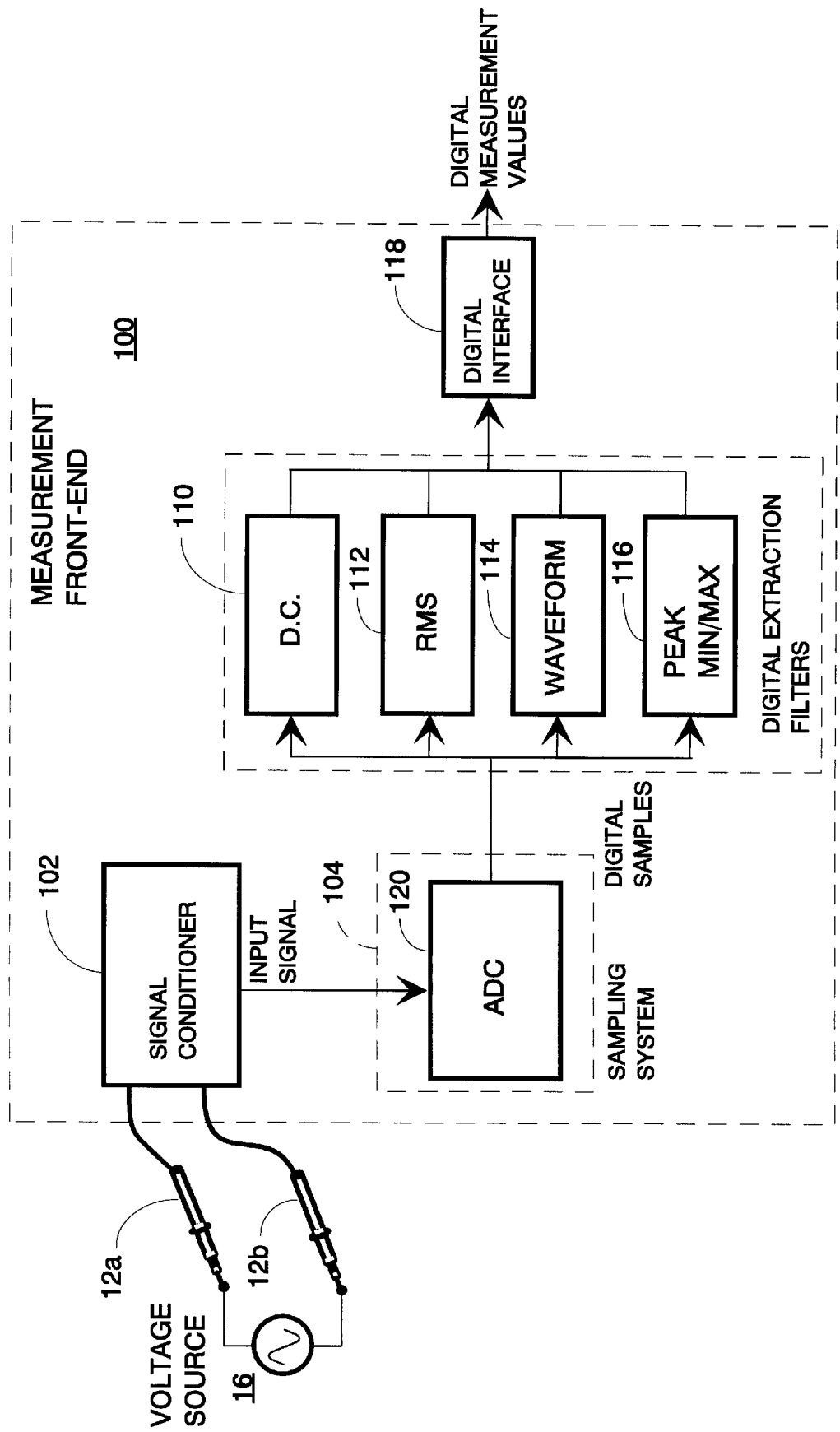
FIG. 8 is a simplified block diagram of a measurement front end for a measurement instrument according to an alternative embodiment of the present invention.

FIG. 8 is a simplified block diagram of the measurement front-end 100 according to an alternative embodiment of the present invention. The sampling system 104 is 116 allows for the simultaneous extraction of any number of desired parameters from the same input signal, the ability of the measurement instrument 10 to be adapted for measuring a wider variety of signal parameters is substantially enhanced.

FIG. 8 is a simplified block diagram of the measurement front-end 100 according to an alternative embodiment of the present invention. The sampling system 104 is implemented with an ADC 120 in place of the sigma-delta converter 106 and decimation filter 108 shown in FIG. 6 to produce the digital samples. Furthermore, other analog-to-digital converter topologies may readily be substituted within the sampling system 104 as long as the sample rate and accuracy of the ADC 120 are adequate for the desired input bandwidth and measurement accuracy of the measurement instrument 10.

It will be obvious to those having ordinary skill in the art that many changes may be made in the details of the above described preferred embodiments of the invention without departing from the spirit of the invention in its broader aspects. For example, greater or fewer numbers of digital extraction filters may be employed to extract as many parameters as desired. The digital extraction filters may be readily adapted to measure additional signal parameters using standard digital filter elements, as well as standard mathematical operation blocks, such as multiplication, square root, and division, as desired. Digital comparators and registers may also be used to detect particular voltage levels. Therefore, the scope of the present invention should be determined by the following claims.

What I claim as my invention is:

1. A measurement front-end for a measurement instrument comprising:
   (a) a signal conditioner for receiving a signal voltage and producing an input voltage from said signal voltage;
   (b) a sampling system coupled to said signal conditioner for receiving said input voltage and producing digital samples of said input signal; and
   (c) a plurality of digital extraction filters connected in parallel and directly coupled to said sampling system to receive simultaneously said digital samples and simultaneously extract a plurality of measurement parameters of said input signal from said digital samples.

2. A measurement front-end for a measurement instrument according to claim 1, wherein said sampling system includes a digital interface coupled to said set of digital extraction filters to receive said simultaneously extracted measurement parameters and provide digital measurement values corresponding to said simultaneously extracted measurement parameters to said measurement instrument.

3. A measurement front-end for a measurement instrument according to claim 1, said sampling system further comprising:
   (a) a sigma-delta converter for receiving said input voltage and producing raw digital samples; and
   (b) a decimation filter coupled to said sigma-delta converter for receiving said raw digital sample and producing said digital samples.

4. A measurement front-end for a measurement instrument according to claim 1, said sampling system further comprising an analog to digital converter for receiving said input voltage and producing said digital samples.

5. A measurement front-end for a measurement instrument according to claim 1, wherein said plurality of digital extraction filters further comprises a d.c. extraction filter, an rms extraction filter, a waveform extraction filter, and a peak min/max extraction filter.

6. A measurement front-end for a measurement instrument according to claim 1, wherein said measurement parameters include d.c., rms, waveform, and peak min/max parameters.

7. A measurement front-end for a measurement instrument according to claim 1 wherein said plurality of digital extraction filters extract said plurality of measurement parameters continuously.

8. In a measurement instrument, a method for obtaining a plurality of measurement parameters from a signal voltage, comprising:
   (a) conditioning said signal voltage to obtain an input signal;
   (b) sampling said input signal in a sampling system to obtain digital samples; and
   (c) extracting simultaneously said plurality of measurement parameters from said digital samples using a plurality of parallel-connected digital extraction filters.

9. In a measurement instrument, a method for obtaining a plurality of measurement parameters from a signal voltage according to claim 8 further comprising selectively providing said plurality of measurement parameters to said measurement instrument as digital measurement values.

10. In a measurement instrument, a method for obtaining a plurality of measurement parameters from a signal voltage according to claim 8, said plurality of digital extraction filters further comprising a d.c. extraction filter, an rms extraction filter, a waveform extraction filter, and a peak min/max extraction filter.

11. In a measurement instrument, a method for obtaining a plurality of measurement parameters from a signal voltage according to claim 10, said plurality of measurement parameters further comprising d.c., rms, waveform, and peak min/max.

12. In a measurement instrument, a method for obtaining a plurality of measurement parameters from a signal voltage according to claim 8, further comprising continuously extracting said plurality of measurement parameters from said digital samples using said plurality of digital extraction filters.

* * * * *